United States Patent
Yeo et al.

(10) Patent No.: US 7,183,593 B2
(45) Date of Patent: Feb. 27, 2007

(54) HETEROSTRUCTURE RESISTOR AND METHOD OF FORMING THE SAME

(75) Inventors: Yee-Chia Yeo, Hsin-Chu (TW); Wen-Chin Lee, Hsin-Chu (TW); Chih-Hsin Ko, Kaohsiung (TW); Chung-Hu Ge, Taipei (TW); Chun-Chieh Lin, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/745,831

(22) Filed: Dec. 24, 2003

(65) Prior Publication Data

US 2005/0127400 A1 Jun. 16, 2005

Related U.S. Application Data

(60) Provisional application No. 60/527,320, filed on Dec. 5, 2003.

(51) Int. Cl.
*H01L 29/86* (2006.01)
*H01L 29/205* (2006.01)

(52) U.S. Cl. .............. 257/195; 257/537; 257/379
(58) Field of Classification Search ............. 257/194, 257/195
See application file for complete search history.

(56) References Cited

U.S. PATENT DOCUMENTS 4,263,518 A * 4/1981 Ballatore et al. .......... 327/565
4,314,269 A 2/1982 Fujiki
4,771,324 A * 9/1988 Odani et al. .............. 257/195
4,810,907 A * 3/1989 Tohyama .................... 326/68
5,357,119 A * 10/1994 Wang et al. ................ 257/18
5,793,913 A 8/1998 Kovacic
6,121,126 A 9/2000 Ahn et al.
6,294,834 B1 9/2001 Yeh et al.
6,350,993 B1 2/2002 Chu et al.
6,399,970 B2 * 6/2002 Kubo et al. ................ 257/194
6,472,685 B2 * 10/2002 Takagi ....................... 257/77
6,489,664 B2 12/2002 Re et al.
6,645,836 B2 11/2003 Kanzawa et al.
2003/0203599 A1 10/2003 Kanzawa et al.

FOREIGN PATENT DOCUMENTS

WO   WO 00/62331 A3   10/2000

OTHER PUBLICATIONS

Chang, S.T., et al., "Energy band structure of strained $Si_{1-x}C_x$ alloys on Si (001) substrate," Journal Of Applied Physics, Oct. 1, 2002, vol. 92, No. 7, American Institute of Physics, pp. 3717-3723.

(Continued)

*Primary Examiner*—Jerome Jackson
(74) *Attorney, Agent, or Firm*—Slater & Matsil, L.L.P.

(57) ABSTRACT

A heterostructure resistor comprises a doped region formed in a portion of a semiconductor substrate, the substrate comprising a first semiconductor material having a first natural lattice constant. The doped region comprises a semiconductor layer overlying the semiconductor substrate. The semiconductor layer comprises a second semiconductor material with a second natural lattice constant.

36 Claims, 3 Drawing Sheets

OTHER PUBLICATIONS

Singh, D.V., et al., "Measurement of the conduction band offsets in Si/Si$_{1-x-y}$Ge$_x$C$_y$ and Si/Si$_{1-y}$C$_y$ heterostructures using metal-oxide-semiconductor capacitors," Journal of Applied Physics, Jan. 15, 1999, vol. 85, No. 2, American Institute of Physics, pp. 978-984.

Theodorou, G., et al., "Electron and optical properties of Si$_{1-y}$C$_y$ alloys," Physical Review B, Oct. 15, 1999 II, vol. 60, No. 16, The American Physical Society, pp. 494-502.

\* cited by examiner

HETEROSTRUCTURE RESISTOR AND METHOD OF FORMING THE SAME

This application claims the benefit of U.S. Provisional Application No. 60/527,320 filed on Dec. 5, 2003, entitled Heterostructure Resistor and Method of Forming the Same, which application is hereby incorporated herein by reference.

TECHNICAL FIELD

The present invention relates generally to semiconductor devices, and more particularly to a system and method of forming a heterostructure resistor.

BACKGROUND

Resistors are common in semiconductor integrated circuits. Resistors exist, for example, in analog and in mixed mode analog and digital circuits. Resistors also exist in input and output circuits as input and output resistors. In addition, resistors may comprise part of an input protection circuit to provide protection of the circuit against electrostatic discharge (ESD) events. In this case, the resistor is used to both attenuate the ESD voltage and to absorb and diffuse ESD energy. Large voltages in the order of thousands of volts may appear across the two terminals of a resistor used for ESD applications.

In integrated circuits resistors may be formed from a poly-crystalline silicon layer, for example. Resistors in integrated circuits may also be formed in a single-crystalline silicon layer. For example, resistors can be formed in a portion of a single-crystal silicon bulk substrate or in a portion of a single crystal silicon layer in a silicon-on-insulator substrate.

As an example, FIG. 1 shows a resistor 100 formed in a portion of a single crystal silicon substrate 102 and defined by isolation structures 106, e.g., shallow trench isolation (STI) or field oxide structures. The resistor body 104 comprises a conductivity type opposite to the substrate 102 doping type, and the resistor body 104 may be defined by the isolation structures 106. Current 108 flows through the resistor body 104 between two terminals 110 coupled at opposite ends of the resistor body 104. The current 108 experiences resistance in the resistor body 104 that is characteristic of a linear current-voltage relationship. Resistors 100 with a resistor body 104 comprising a single-crystalline semiconductor material characteristically demonstrate higher stability and lower noise than conventional poly-crystalline resistor structures.

SUMMARY OF THE INVENTION

Preferred embodiments of the present invention provide a structure and method of forming a heterostructure resistor. The performance of a resistor formed from a single-crystalline semiconductor material can be improved further by introducing strain into the body of the resistor, thereby improving resistor features, including carrier mobility, enhanced sheet resistance and noise reduction.

In accordance with a preferred embodiment of the present invention, a structure of a resistor comprises a doped region formed in a portion of a semiconductor substrate. The substrate comprises a first semiconductor material having a first natural lattice constant. The doped region comprises a semiconductor layer overlying the semiconductor substrate. The semiconductor layer comprises a second semiconductor material with a second natural lattice constant.

In accordance with another preferred embodiment of the present invention, a system for a semiconductor chip comprises a semiconductor substrate. The semiconductor substrate comprises a first semiconductor material having a first natural lattice constant. A first active region is formed in a first portion of the substrate and a second active region is formed in a second portion of the substrate. A heterostructure resistor is formed in the first active region, the resistor comprising a doped region comprising a second semiconductor material having a second natural lattice constant. A transistor is formed in the second active region.

In accordance with another preferred embodiment of the present invention, a method of forming a resistor includes providing a semiconductor substrate comprising a first semiconductor material with a first natural lattice constant. An active region is formed in a portion of the substrate. A recess is formed in the active region and a semiconductor layer comprising a second semiconductor material with a second natural lattice constant is formed in the recess. A doped region is formed in at least a portion of the semiconductor layer and a portion of the substrate.

BRIEF DESCRIPTION OF THE DRAWINGS

For a more complete understanding of the present invention, and the advantages thereof, reference is now made to the following descriptions taken in conjunction with the accompanying drawings, in which:

FIG. 2b shows a plan view of the embodiment of FIG. 2a;

DETAILED DESCRIPTION OF THIS INVENTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A preferred embodiment of the present invention relates to the field of semiconductor devices, and more specifically, to forming a heterostructure resistor. Advantages of the present invention include reduced noise and enhanced resistance in a heterostructure resistor.

Figure 1:
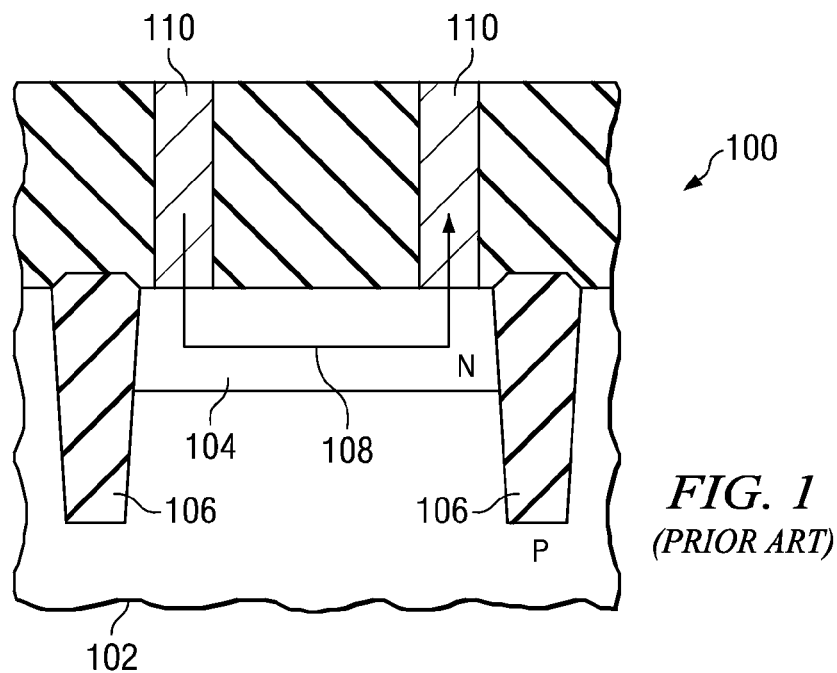
FIG. 1 shows a prior art conventional resistor formed in a portion of the substrate.
Figure 2A:
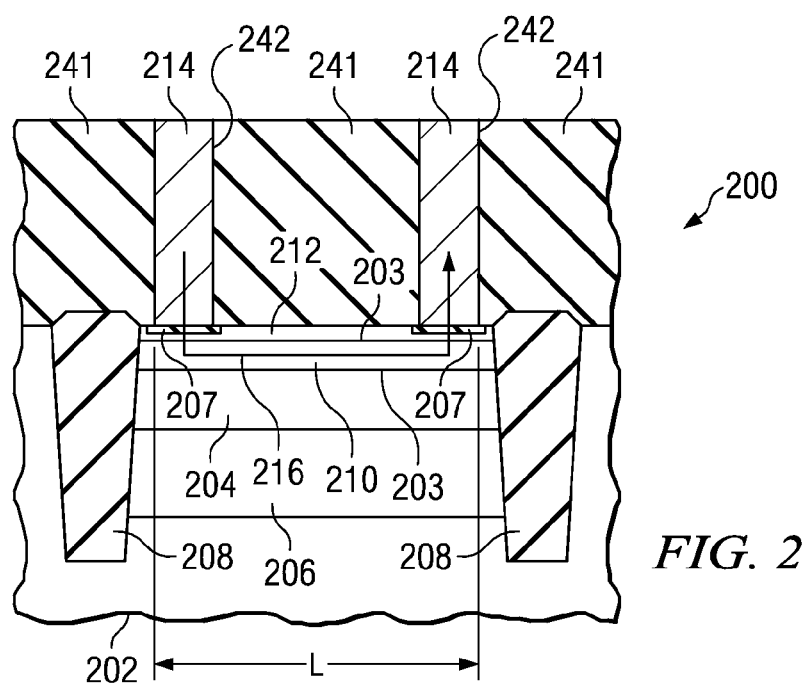
FIG. 2a shows a cross sectional diagram of a preferred embodiment of the present invention.
Figure 2B:
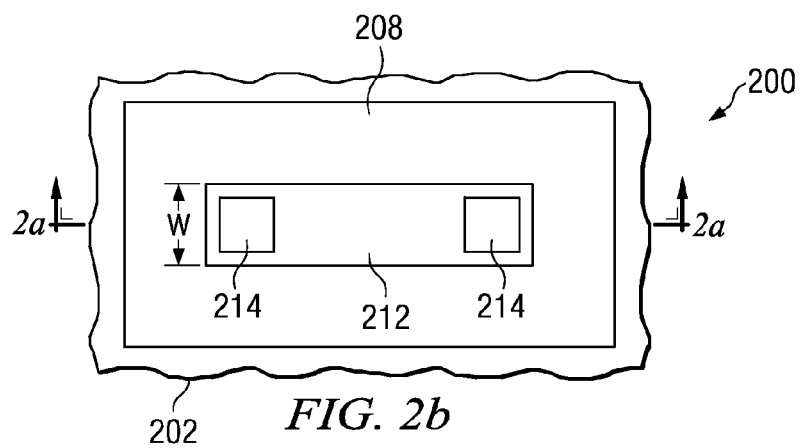

A cross-section in FIG. 2a shows a preferred embodiment of the present invention from the perspective of the line 2a–2a' drawn across heterostructure resistor 200 in the layout view of FIG. 2b. FIGS. 2a and 2b are herein collectively referred to as FIG. 2. The resistor 200 of this invention may have a rectangular layout width W and a length L. The width W may have a dimension larger than about 0.1 micron, and preferably larger than about 1 micron. In the preferred embodiment, the length L may have a dimension larger than about 0.1 micron, and preferably larger than about 1 micron. The resistor 200 of the present invention may have a layout with a serpentine shape, or any other shape commonly used in the art for diffusion resistors.

FIG. 2a shows a first semiconductor layer 202, herein also referred to as a semiconductor substrate, preferably comprises a bulk silicon material having a single crystal lattice structure doped to a preferred or desired dopant density and conductivity. It is understood that the first semiconductor layer 202 may comprise a semiconductor-on-insulator (SOI) substrate. An SOI substrate has a first silicon layer overlying an insulating layer, e.g., a silicon oxide layer. The silicon oxide layer overlies a substrate, e.g., a second silicon layer. The silicon layers in the SOI substrate may be a relaxed silicon layer or a strained silicon layer.

The resistor 200 of FIG. 2 has a doped body region 204, also referred to as a resistor body 204, formed on a portion of the substrate 202. The resistor may be defined by isolation structures 208, such as the shallow trench isolation (STI) structures 208 shown in FIG. 2. The doping type of the doped body region 204 is opposite to the doping type of the semiconductor well region 206 immediately underlying the body region 204. The well region 206 comprising the body region 204 may optionally be doped to a different conductivity type than the substrate region 202. For example, if the resistor body 204 is doped p-type, the resistor body 204 may be formed on an n-type well region 206, the n-type region 206 having a p-type substrate 202 underneath. Alternatively, the well region 206 may comprise the same material as the substrate 202, and an n-type resistor body 204 may overlie a p-type well region 206, the p-type well region 206 overlying the p-type substrate 202. The average doping concentration of the resistor body 204 may be in the range of about $10^{16}$ to about $10^{19}$ cm$^{-3}$, for example.

In the embodiment shown in FIG. 2, a second semiconductor layer 210 is buried beneath a capping layer 212. The capping layer is formed in a portion of the resistor body 204 and preferably comprises the same semiconductor material as the portion of the resistor body 204 underlying the second semiconductor layer 210.

This embodiment of the present invention provides a resistor 200 with a doped body region 204 comprising semiconductor heterostructures 203. A semiconductor heterostructure, also referred to as a semiconductor layer junction or a semiconductor heterojunction, is a structure with two different semiconductor materials in intimate atomic contact.

As shown in FIG. 2a, the resistor 200 has a second semiconductor layer 210 formed from a second semiconductor material. The lattice constant of the second semiconductor material is not equal to the lattice constant of the first semiconductor material. The first semiconductor material is found in the well region 206, including doped region 204, below the second semiconductor layer 210 and also in the capping layer 212 that overlies the second semiconductor layer 210. The second semiconductor layer 210, atomically coupled with the well region 206 and the capping layer 212, forms heterojunctions 203 comprised of atomically coupled semiconductor materials having mismatched lattice structures.

As shown in FIG. 2a, an interlevel dielectric 241 overlies the resistor structure. Conductive material is formed in contact holes 242 within the interlevel dielectric 241 to form conductive contacts 214. A voltage difference applied to the conductive contacts 214 results in current flow along the current path 216.

In the preferred embodiment, the first semiconductor material is preferably silicon, and the second semiconductor material is preferably silicon-germanium, e.g., SiGe or $Si_{1-x}Ge_x$. The mole fraction x of Ge in $Si_{1-x}Ge_x$ may be in the range of about 0.1 to about 0.9. The p-type Si—SiGe heterostructure resistor 200 of the preferred embodiment conducts current 216 using holes as the majority charge carriers. Due to a valence band offset between Si and SiGe, a quantum well is formed in the SiGe layer, and carriers are confined in the SiGe layer. A potential difference or a voltage applied across the two terminals 214 of the resistor 200 results in current 216 flowing through the resistor 200 along a current path 216, as shown in FIG. 2a. A substantial portion of the current 216 flowing through the resistor 200 flows in the SiGe layer 210 due to carrier confinement as described above.

In another embodiment, the first semiconductor material is silicon and the second semiconductor material is silicon-carbon, e.g., SiC or $Si_{1-y}C_y$. In this embodiment, the doping-type of the body region 204 is n-type and the well region 206 and substrate 202 are p-type. The mole fraction y of C in $Si_{1-y}C_y$ may be in the range of about 0.01 to about 0.04. The n-type Si—SiC heterostructure resistor 200 conducts current 216 using electrons as the majority charge carriers. Due to a conduction band offset between Si and SiC, a quantum well is formed in the second semiconductor layer 210, and most of the charge carriers flow in the second semiconductor layer 210. Therefore, a substantial portion of the current 216 flows in the second semiconductor layer 210.

While the second semiconductor layer 210 may comprise $Si_{1-x}Ge_x$ and $Si_{1-y}C_y$, other semiconductor materials may be used. For example, the second semiconductor layer 210 may comprise a semiconductor alloy such as $Si_{1-x-y}Ge_xC_y$. In this case, the mole fraction x of Ge may range from about 0.1 to about 0.9 and the mole fraction y of C may range from about 0.01 to about 0.04.

The preferred embodiment of the present invention offers significant improvement in noise performance resulting from charge carriers flowing in a quantum well formed by heterojunctions 203 in the resistor body 204. One advantage of the present invention is diminished carrier trapping and detrapping along the current path 216.

The resistor body 204 predominantly contributes to the resistance between the two terminals 214 of the resistor 200. The doped region constituting the resistor body 204 is not silicided to maintain a high resistance along the length L of the resistor 200, however a silicide 207 may be formed on the portion of the resistor body 204 underlying the conductive contacts 214. Metallic silicides may include, but will not be restricted to, nickel silicide, cobalt silicide, tungsten silicide, titanium silicide, tantalum silicide, platinum silicide, and erbium silicide. A heavily doped region may also be formed in the portion of the doped body region 204 underlying the conductive contacts.

Sheet resistance, known to one skilled in the art as the resistance in ohms per square unit of surface area, increases with the flow of majority carriers through a strained heterostructure layer, such as the current flow 216 through the second semiconductor layer 210 of the heterostructure resistor 200. An increased sheet resistance diminishes the surface area required by a resistor to form a desired amount of resistance. The heterostructure resistor of the present invention may therefore occupy a smaller area than a prior art diffusion resistor in order to form an equivalent amount of resistance.

Figure 3:
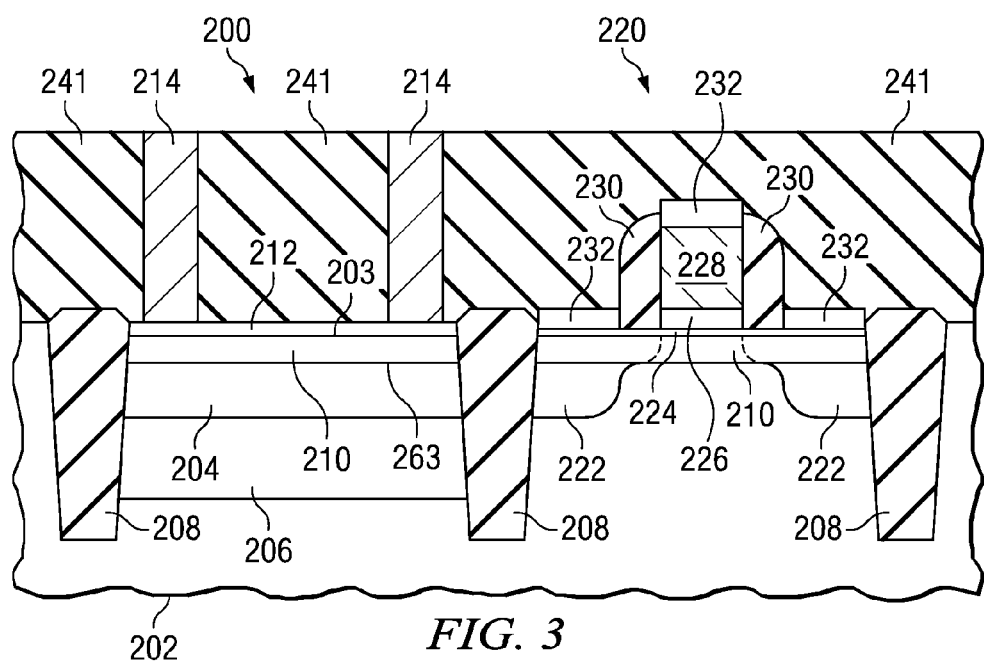
FIG. 3 illustrates another embodiment of the present invention.

The resistor 200 may be integrated with other semiconductor devices. One example, a resistor integrated with a strained channel transistor 220, is shown in FIG. 3. In this example, the strained channel transistor 220 includes a channel region 224, formed from a first semiconductor material 202. Source and drain regions 222 are formed within the first semiconductor material 202 and adjacent opposite ends of the channel region. At least a portion of the source and drain regions 222 are formed from the second semiconductor material. As before, the second semiconductor material has a second natural lattice constant that is different from the natural lattice constant of the first material 204. In the illustrated embodiment, the layer 210 of second semiconductor material also extends through the channel. In other embodiments, such as disclosed in co-pending application Ser. No. 10/729,095 filed on Dec. 5, 2003, the second semiconductor material may be substantially aligned with the sidewall spacers 230.

A gate dielectric 226 overlies the channel region 224 and a gate electrode 228 overlies the gate dielectric 226. The gate dielectric 226 can be formed on the channel region 224 using any gate dielectric formation process known and used in the art, e.g., thermal oxidation, nitridation, sputter deposition, or chemical vapor deposition. The physical thickness of the dielectric 226 may be in the range of about 5 to about 100 angstroms. The transistor gate dielectric 226 may employ a gate dielectric such as silicon oxide and silicon oxynitride or a high permittivity (high-k) gate dielectric, or combinations thereof.

The high-k dielectric preferably has a permittivity of larger than 8. This dielectric can be one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthanum oxide ($La_2O_3$), cerium oxide $CeO_2$), titanium oxide ($TiO_2$), tantalum oxide ($Ta_2O_5$), or combinations thereof. In the preferred embodiment, the high-k dielectric is hafnium oxide. The silicon equivalent oxide thickness (EOT) of the dielectric 226 is preferably less than about 50 angstroms, more preferably less than about 20 angstroms, and even more preferably less than about 10 angstroms. The physical thickness of the dielectric 226 may be less than about 100 angstroms, more preferably less than about 50 angstroms, and even more preferably larger than about 20 angstroms.

The gate electrode 228 can be poly-crystalline silicon, poly-crystalline silicon germanium, metals, metallic silicides, metallic nitrides, or conductive metallic oxide. In the preferred embodiment, the electrode 228 comprises poly-crystalline silicon. Metals such as molybdenum, tungsten, titanium, tantalum, platinum, and hafnium may be used as the portion of the top electrode 228. Metallic nitrides may include, but are not restricted to, molybdenum nitride, tungsten nitride, titanium nitride, and tantalum nitride. Metallic silicides may include, but will not be restricted to, nickel silicide, cobalt silicide, tungsten silicide, titanium silicide, tantalum silicide, platinum silicide, and erbium silicide. Conductive metallic oxides may include, but will not be restricted to, ruthenium oxide and indium tin oxide.

Spacers 230, formed from one or more dielectric materials, are formed on the sidewalls of the gate electrode 228. A silicide 232 overlays the gate electrode 228 and the source and drain regions 222.

Figure 4A:
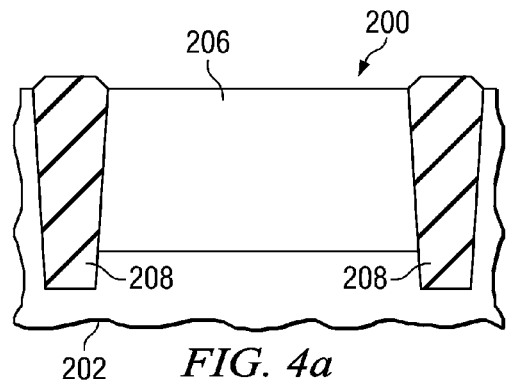
FIGS. 4a–4f show a process flow demonstrating a method of forming a heterostructure resistor.

Referring now to FIGS. 4a–4f, a method of manufacturing the heterostructure resistor 200 is described. In FIG. 4a, a semiconductor substrate 202 preferably comprises a silicon material. Isolation structures 208 are formed to define active regions 206 in the substrate 202. The isolation structures 208 may be formed using standard shallow trench isolation processes. For example, trenches are etched with depths in the range of about 2000 to about 6000 angstroms, a liner oxide with a thickness of about 10 to 200 angstroms is formed on the trench sidewall using thermal oxidation, and the trenches are filled with a trench filling dielectric material, e.g., by chemical vapor deposition. In other embodiments, other types of isolation can be used. For example, field oxide regions can be formed by the well known LOCOS (local oxidation of silicon) process.

Ion implantation may form an active region 206 in a portion of the substrate 202, if the substrate is not already doped to the desired concentration. The active region 206 may be doped with n-type or p-type dopants. The ion implantation may implant a n-type dopant such as phosphorus or a p-type dopant such as boron with a dose of about $5 \times 10^{12}$ $cm^{-2}$ to $10^{14}$. The active region 206 may also be referred to as a well region 206.

Figure 4B:
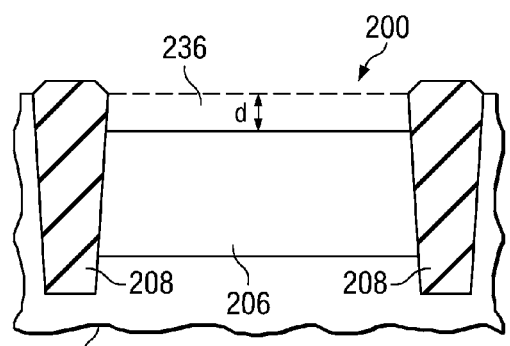

A recess region 236 with depth d is etched in the active region 234, as shown in FIG. 4b. The etch may be accomplished by a plasma etch using chlorine and bromine chemistry, for example. The depth d of the recess 236 may range from about 50 angstroms to about 1000 angstroms. An optional anneal at a temperature of about 800 degrees Celsius to 1000 degrees Celsius may be performed to facilitate silicon migration to repair any etch damage as well as to slightly smoothen the silicon surface for the subsequent epitaxy process. During this step, a trench for a simultaneously formed transistor (220 in FIG. 3) can also be formed.

Figure 4C:
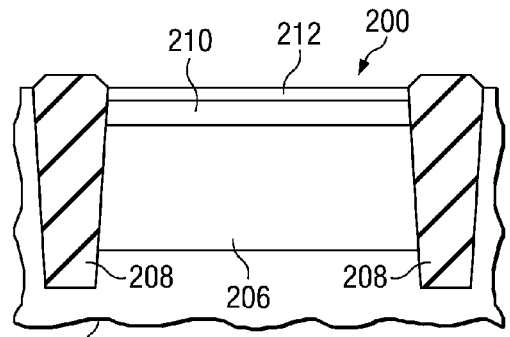

Referring to FIG. 4c next, the second semiconductor material is epitaxially grown in the recessed region 236 to at least partially fill the recessed region 236, forming a second semiconductor layer 210. As shown in the figure, the first semiconductor material may be epitaxially grown on the second semiconductor layer 210 to form a capping layer 212. The capping layer is optional. The atomic coupling of the first and second materials at the heterojunction 203 of the well region 206 and second semiconductor layer 210 and at the heterojunction 203 of the capping layer 212 and the second semiconductor layer 210 forms a heterostructure resistor 200.

The epitaxy process used to perform epitaxial growth may be chemical vapor deposition, ultra-high vacuum chemical vapor deposition (UHV-CVD), or molecular beam epitaxy, for example. In the preferred embodiment, the epitaxy growth employs chemical vapor deposition at a temperature in the range of 300 degrees Celsius to 800 degrees Celsius. Epitaxially grown materials may also extend above the surface of the channel region of the transistor. In a first embodiment, the second semiconductor layer 210 comprises a second semiconductor material comprising silicon germanium $Si_{1-x}Ge_x$ with a germanium mole fraction x between about 0.1 and about 0.9. In another embodiment, the second semiconductor layer 210 comprises silicon-carbon $Si_{1-y}C_y$ with a carbon mole fraction y of between about 0.01 and about 0.04.

As shown in FIG. 3, the resistor can be formed on the same chip as a transistor. In this embodiment, the gate stack (e.g., gate electrode 228 on the gate dielectric 226) can be formed after the etching of the trench 236 and the forming of the second semiconductor layer 210. In this embodiment, the transistor 220 would have a channel region that comprises the second semiconductor layer. The resulting structure would be that in FIG. 3.

In an alternate embodiment, the gate stack of the transistor can be formed before the etching of the trench 236 and the selective epitaxy of the second semiconductor layer 210 in the trench. Preferably, gate sidewall spacers are also formed prior to the trench etching and selective epitaxy process. In this second embodiment, the transistor would have a channel region comprising the first semiconductor material, and the second semiconductor material in the transistor structure would be adjacent to the channel region. A structure of this nature is taught in co-pending application Ser. No. 10/729,095 filed on Dec. 5, 2003, which is incorporated herein by reference. Further information, on manufacturing this structure can be found in the co-pending application.

Returning to FIG. 4c, the epitaxially grown first and second semiconductor layers 210 and 212 may be in-situ doped or undoped during the epitaxial growth. If undoped, they may be doped subsequently and the dopants may be activated using a rapid thermal annealing process. The dopants may be introduced by conventional ion implantation, plasma immersion ion implantation (PIII), gas or solid source diffusion, or any other techniques known and used in the art. Any implant damage or amorphization can be annealed through subsequent exposure to elevated temperatures.

Figure 4D:
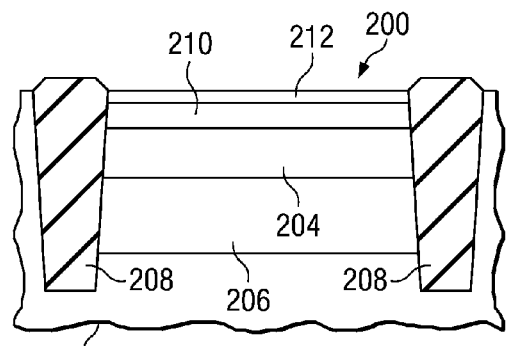

A first shallow implant may be first performed to dope the shallow regions of the resistor body 204. A second and deeper implant is then performed. The resistor 200 formed at this stage is shown in FIG. 4d.

Figure 4E:
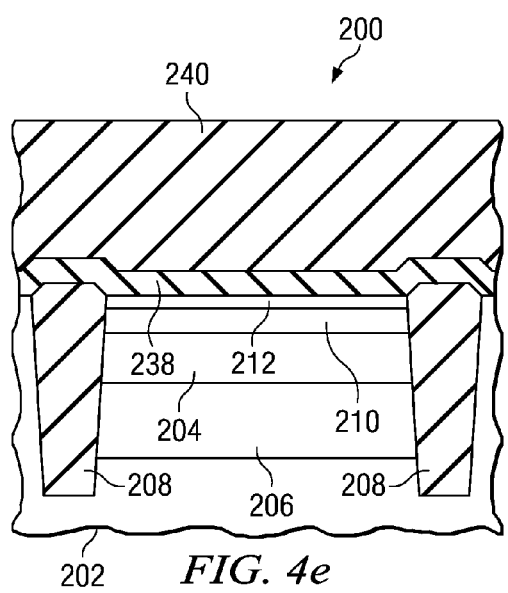
Figure 4F:
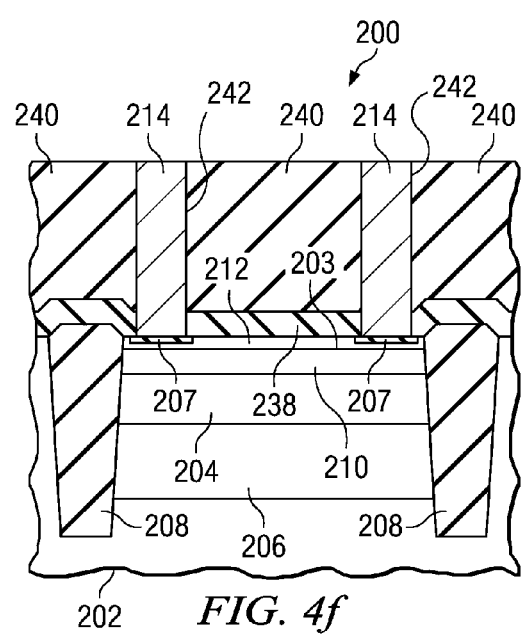

Next, a contact etch stop layer 238 may be formed, followed by the deposition of a passivation layer 240, as shown in FIG. 4e. Contact holes 242 are then etched through the passivation layer 240, stopping on the contact etch stop layer 238. After etch stop layer 238 is etched, a conductive material fills the contact holes 242 to form conductive contacts 214 to the heterostructure resistor 200, as shown in FIG. 4f. The conductive material may comprise Cu (Copper), Al (Aluminum), Ag (Silver), Au (Gold), or W (Tungsten), as examples. A silicide 207 may be formed where the conductive material overlies the resistor body.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A fixed value passive resistor comprising:
   a substrate comprising a doped semiconductor material;
   a first semiconductor layer of a first semiconductor material with a dopant of a first type overlying said substrate;
   a predetermined region with a dopant of a second type opposite to the dopant of the first type in a portion of said first semiconductor layer, said predetermined region having a first natural lattice constant said predetermined region extending between a first contact area and a second contact area;
   a second semiconductor layer of a second semiconductor material overlying and in direct contact with said predetermined region, said second semiconductor material having a second natural lattice constant different than the first natural lattice constant;
   a first resistor terminal electrically coupled to said first contact area of said predetermined region;
   a second resistor terminal electrically coupled to said second contact area of said predetermined region such that the predetermined region between the first resistor terminal and the second resistor terminal comprises a resistor body; and
   an interlevel dielectric layer covering and isolating said predetermined region, except for first and second apertures defined in said interlevel dielectric layer to provide electrical connections to said first and second contact areas such that said resistor body is a passive and fixed resistor body.

2. The resistor of claim 1 wherein the first resistor terminal and the second resistor terminals each comprise a heavily doped region within the predetermined region.

3. The resistor of claim 1 wherein the predetermined region has a doping type opposite from the doping type of the substrate.

4. The resistor of claim 3 wherein the predetermined region has an n-type doping.

5. The resistor of claim 3 wherein the predetermined region has a p-type doping.

6. The resistor of claim 1 wherein the predetermined region has an average doping concentration in the range of $10^{16}$ to $10^{19}$ cm$^{-3}$.

7. The resistor of claim 1 and further comprising a cap layer overlying and in direct contact with the second semiconductor layer, the cap layer comprising the first semiconductor material.

8. The resistor of claim 1 wherein the second natural lattice constant is larger than the first natural lattice constant.

9. The resistor of claim 8 wherein the first semiconductor material comprises silicon and the second semiconductor material comprises silicon and germanium.

10. The resistor of claim 9 wherein the mole fraction of germanium in the second semiconductor material is in the range of about 0.1 to about 0.9.

11. The resistor of claim 1 wherein the second natural lattice constant is smaller than the first natural lattice constant.

12. The resistor of claim 11 wherein the first semiconductor material is silicon and the second semiconductor material comprises silicon and carbon.

13. The resistor of claim 12 wherein the mole fraction of carbon in the second semiconductor material is in the range of about 0.01 to about 0.04.

14. The resistor of claim 1 wherein the predetermined region, is between first and second isolation-regions.

15. The resistor of claim 14 wherein the isolation region is a shallow trench isolation region.

16. The resistor of claim 1 wherein the semiconductor substrate is a bulk semiconductor substrate.

17. The resistor of claim 1 wherein the semiconductor substrate is a semiconductor-on-insulator substrate.

18. A semiconductor chip comprising:
   a semiconductor substrate comprising a doped semiconductor material;
   a first active region formed in a first portion of the substrate;
   a second active region in a second portion of the substrate;
   a heterostructure fixed passive value resistor in the first active region, the resistor comprising;
   a first semiconductor layer of a first semiconductor material with a dopant of a first type overlying said substrate, a predetermined region with a dopant of a second type opposite to said first type in said first semiconductor layer, the predetermined region having a first natural lattice constant, a second semiconductor layer of a second semiconductor material overlying and in direct contact with said predetermined region, said second semiconductor material having a second natural lattice constant different than the first natural lattice constant an interlevel dielectric layer covering and isolating said predetermined regions except for first and second resistor terminals electrically coupled to said predetermined region such that said predetermined region between said first and second resistor terminals comprise a passive resistor body having a fixed resistance; and a transistor in the second active region.

19. The chip of claim 18 wherein the predetermined region has a doping type opposite from the doping type of the semiconductor substrate.

20. The chip of claim 18 wherein the predetermined region has a doping concentration in the range of $10^{16}$ to $10^{19}$ cm$^{-3}$.

21. The chip of claim 18 further comprising a cap layer overlying and in direct contact with the second semiconductor layer, and wherein the cap layer comprises the first semiconductor material.

22. The chip of claim 18 wherein, the second natural lattice constant is larger than the first natural lattice constant.

23. The chip of claim 18 wherein the first semiconductor material comprises silicon and the second semiconductor material comprises silicon and germanium.

24. The chip of claim 18 wherein the second natural lattice constant is smaller than the first natural lattice constant.

25. The chip of claim 18 wherein the first semiconductor material comprises silicon and the second semiconductor material comprises silicon and carbon.

26. The chip of claim 18 wherein the transistor is a strained channel transistor.

27. The chip of claim 18 wherein the transistor comprises a source region and a drain region oppositely adjacent to a channel region, at least a portion of each of the source region and the drain region comprising the second semiconductor material.

28. The chip of claim 27 wherein the transistor is a p-type transistor and the second semiconductor material comprises silicon and germanium.

29. The chip of claim 27 wherein the transistor is an n-type transistor and the second semiconductor material comprises silicon and carbon.

30. The chip of claim 18 wherein the semiconductor substrate is a bulk semiconductor substrate.

31. The chip of claim 18 wherein the semiconductor substrate is a semiconductor-on-insulator substrate.

32. The resistor of claim 1 wherein said first resistor terminal is coupled to the predetermined region through the second semiconductor layer.

33. The resistor of claim 1 wherein said second resistor terminal is coupled to the predetermined region through the second semiconductor layer.

34. The resistor of claim 32 wherein said second resistor terminal is coupled to the predetermined region through the second semiconductor layer.

35. The fixed value resistor of claim 1 wherein said aperture in said interlevel dielectric layer over said fixed value resistor is a first contact hole and a second contact hole extending from said top surface to said first resistor terminal and said second resistor terminal respectfully and further comprising an electrically conductive material disposed in said first and second contact holes to form conductive contacts.

36. The semiconductor chip of claim 18 wherein said interlevel dielectric layer over said fixed value resistor defines a first contact hole and a second contact hole extending from said top surface to said first resistor terminal and said second resistor terminal respectfully and further comprising an electrically conductive material disposed in said first and second contact holes to form conductive contacts.

* * * * *